United States Patent [19]
Robertson et al.

[11] Patent Number: 5,366,585
[45] Date of Patent: Nov. 22, 1994

[54] METHOD AND APPARATUS FOR PROTECTION OF CONDUCTIVE SURFACES IN A PLASMA PROCESSING REACTOR

[75] Inventors: Robert Robertson, Palo Alto; Kam S. Law, Union City; John M. White, Hayward, all of Calif.

[73] Assignee: Applied Materials, Inc., Santa Clara, Calif.

[21] Appl. No.: 10,975

[22] Filed: Jan. 28, 1993

[51] Int. Cl.$^5$ ............................................. B44C 1/22
[52] U.S. Cl. ................................... 156/643; 156/345; 134/1
[58] Field of Search ............ 156/345, 643, 646; 134/1, 34; 204/192.32, 192.37, 298.31, 298.35, 298.01, 298.02, 298.11; 118/723 R, 723 E

[56] References Cited
U.S. PATENT DOCUMENTS

| | | | |
|---|---|---|---|
| 4,491,496 | 1/1985 | Laporte et al. | 204/298.31 X |
| 4,563,367 | 1/1986 | Sherman | 427/39 |
| 4,875,989 | 10/1989 | Davis et al. | 204/298 |
| 4,960,488 | 10/1990 | Law et al. | 156/643 |
| 4,995,341 | 2/1991 | Matsuyama | 118/723 |
| 5,000,113 | 3/1991 | Wang | 118/723 |
| 5,065,698 | 11/1991 | Atsushi | 118/719 |
| 5,069,938 | 12/1991 | D'Arey | 427/255.1 |
| 5,074,456 | 12/1991 | Degner et al. | 204/298.31 X |
| 5,085,727 | 2/1992 | Steger | 156/345 |
| 5,137,610 | 8/1992 | Shumate et al. | 204/298.31 X |

Primary Examiner—William Powell
Attorney, Agent, or Firm—Shirley L. Church

[57] ABSTRACT

An apparatus and method for protecting conductive, typically metallic, walls (212) of a plasma process chamber (200) from accumulation of contaminants thereon and from reaction with a gas plasma and either deposition-gas plasma by-products. A ceramic barrier material (220-223), preferably of at least 0.005 inches (127) micrometers) thickness, is used adjacent the conductive portions of the reactor chamber and between the gas plasma and such conductive portions to be protected. The ceramic barrier material reduces the deposit of compounds formed from the plasma on protected reactor chamber surfaces and thereby avoiding the formation of a source of particulates. Further, the ceramic barrier material enables cleaning of the reactor chamber using an etch plasma generated from halogen-comprising gas without the etch plasma attacking protected metallic portions of the reactor. The ceramic liner can serve an additional function of preventing arcing or local intense plasma discharge from a plasma-generation electrode (216), to a conductive portion of the reactor chamber.

29 Claims, 4 Drawing Sheets

METHOD AND APPARATUS FOR PROTECTION OF CONDUCTIVE SURFACES IN A PLASMA PROCESSING REACTOR

BACKGROUND OF THE INVENTION

1. Field of the Invention

The present invention pertains to a method and apparatus for protecting the conductive, typically metallic, portions of gas plasma process chambers with a material which can be cleaned using gas plasma etching procedures.

2. Background of the Invention

The semiconductor industry relies on high throughput, single substrate processing reactors which can be used for a variety of different processes such as thermal chemical vapor deposition (CVD), plasma-enhanced CVD (PECVD), plasma-assisted etching, and deposition topography modification by sputtering. It is preferable to have such processing reactors be self cleaning using plasma etching techniques to avoid labor-intensive manual cleaning and loss of productivity which arise when the reactor must be opened for cleaning.

The PECVD processing reactor chambers, which contain controlled gaseous environments at reduced pressures, are generally constructed of aluminum, although specialty alloys and materials such as quartz have been used at times. Due to the broad experience of the semiconductor industry with aluminum reaction chambers, an understanding of the effect of the presence of the aluminum upon products produced in the reactors has been developed. Thus, those working in the industry are comfortable with the use of aluminum reaction chambers. However, as described in U.S. Pat. No. 4,563,367 to Sherman, plasma-assisted chemical vapor deposition processes tend to form deposits on internal surfaces of the reaction chambers so that the surface of the aluminum reaction chambers must be periodically cleaned.

This periodic cleaning can be done by disassembling the chamber and immersing the chamber parts in a wet chemical etchant bath or by mechanically cleaning the chamber parts. However, these methods are time consuming and may produce yield-decreasing particulates and contaminants. An alternative to these methods is a self-cleaning reactor system, wherein the reaction system plasma electrodes or coils are used to generate an etching plasma which does the cleaning. Typically an etching plasma generated from $CF_4$ and $O_2$ is used to clean the reactor chamber. However, it has been discovered that after several plasma cleaning sequences, reactor system performance frequently degrades to the point that non-uniform depositions on semiconductor wafers occur. Investigation of the possible causes of this performance degradation led to the discovery that aluminum trifluoride ($AlF_3$) crystallized on the bare aluminum upper electrode of the reactor system during standard plasma self-cleaning. One theory of causation was that the deposits resulted from ion bombardment by active fluorine species in the high RF field which was applied between the electrodes during the plasma self-cleaning process. It was further theorized that the fluorine destroyed the natural oxide protective coating on the bare aluminum of the upper electrode and that the $AlF_3$ deposits formed during the plasma self-cleaning cycles. Sherman concluded that use of a small, enclosed plasma generation chamber within a conventional semiconductor-processing vacuum chamber controlled certain highly active species within the generation chamber, enabling the use of increased RF power (higher plasma etching rates) without damage to the conventional semiconductor-processing vacuum chamber. Thus, higher semiconductor-processing etch rates should be possible without increasing the required frequency of wet chemical cleaning of the conventional processing vacuum chamber. The small, enclosed plasma generation chamber is constructed from a ceramic material such as aluminum oxide. He said that the conventional processing vacuum chamber could be constructed with either metallic or ceramic walls, but he stated no preference. Another attempt to reduce the formation of deposits on CVD reaction chamber walls is described in U.S. Pat. No. 4,875,989 to Davis et al. Davis et al. describe the use of a conical baffle which is in proximity to the wafer face, to direct the stream of activated species. The conical baffle is fabricated from aluminum which is anodized over its entire surface except for its base.

U.S. Pat. No. 4,960,488 to Law et al., issued Oct. 2, 1990, describes a process for cleaning a reactor chamber, both locally adjacent to the RF electrodes and also throughout the chamber and exhaust system. Preferably, a two-step continuous etch sequence is used in which the first step uses relatively high pressure, close electrode spacing and fluorocarbon gas chemistry.. The second step uses relatively lower pressure, farther electrode spacing and fluoride gas chemistry. Typically, an etch gas mixture of $C_2F_6$ and $O_2$ is used for the first cleaning step, and $NF_3$ is used as the etch gas for second cleaning step. To avoid the formation of contaminant compounds, which occurs when halogen-containing plasmas contact aluminum reactor chamber walls during etch cleaning and to reduce the amount of etch cleaning necessary, the reactor chamber is designed to have spacing between elements which reduces the opportunity for active CVD species to deposit on chamber walls outside the wafer area. In addition, particular surfaces inside the process chamber are temperature controlled to reduce gas decomposition, or condensation on chamber walls and the reactor is designed to have purging gas flow to prevent deposition of CVD materials outside the wafer area.

In a further attempt to protect the aluminum reactor chamber from attack by fluorine-containing gases, Lorimer et al. developed a method of forming a corrosion-resistant protective coating on an aluminum substrate, as described in U.S. Pat. No. 5,069,938. The protective coating is formed by first forming a high purity aluminum oxide layer on an aluminum substrate and then contacting the aluminum oxide layer with one or more high purity fluorine-containing gases at elevated temperature. The aluminum oxide layer may be either a thermally formed layer or an anodically formed layer having a thickness from at least about 0.1 micrometer up to about 20 micrometers. The preferred fluorine-containing gases will comprise acid vapors. Examples of fluorine-containing gases include gaseous HF, $F_2$, $NF_3$, $CF_4$, $CHF_3$, and $C_2F_6$. As is evidenced by the process and the description of the finished coating, the fluoride-containing gas penetrated the aluminum oxide (possibly to the aluminum surface beneath) to form fluorine-containing compounds within. The protective coating of Lorimer et al. is intended to protect the chamber walls of the processing apparatus from the chemicals used in chemical vapor deposition and etching processes. However, applicants have determined that a thermal or anodized aluminum oxide coating of 20 micrometers or less on an aluminum surface does not prevent the gradual build up of fluoride-containing compounds such as aluminum trifluoride ($AlF_3$), ammonium fluoride ($NH_4F$), and aluminum oxyfluorides ($AlO_xF_y$) upon the outer surface of the coating. These compounds eventually peel off from the surface of the coating and become a source of particulate contamination.

As can be seen from the above descriptions, the semiconductor industry would find it highly desirable to have a means of preventing the build up of deposits on aluminum process reaction chambers. Build up must be prevented even when the process reactor chamber is designed to limit plasma operational areas to the minimum space possible within the reactor, with a spacing between reactor elements which reduces the opportunity for active CVD species to deposit on chamber walls outside the wafer area.

There has been heightened interest in liquid crystal displays in recent years, in particular for flat panel displays such as computer display screens, direct view and projection television screens, and navigation and communication instruments. Such liquid crystal flat panel displays utilize the kinds of materials and physical structures generally present in semiconductor devices. Many of the processes required to fabricate the liquid crystal displays are the same processes as those used to produce semiconductor devices. Thus, semiconductor process equipment is presently being modified for use in the production of such flat panel displays. For many of the process steps, plasma-assisted CVD and plasma etching is utilized. Typically the substrate to be processed is positioned on a lower, grounded platen electrode, while the RF power is applied to the upper electrode. The reactant gases are discharged in the region of the upper electrode and a plasma forms between the two electrodes. Because the rectangular flat panel display substrates are very large by comparison to silicon wafers (up to 360×4.50 mm flat panels compared to 200 mm maximum diameter for silicon wafers), it is impractical to make the process reaction chamber very much larger than the plasma zone. The close proximity of the reactor chamber walls to the plasma zone increases the amount of deposition on the chamber walls and increases the possibility for arcing between the platen electrode and the chamber walls.

The build up of deposition on reaction chamber walls is critically important since flat panel displays are as sensitive to particulate contamination because they include semiconductor devices with submicron geometries. The flat panel design geometries, that is, lateral dimension, are typically large, in the range of 5 to 20 $\mu m$. However, the device layers, that is, vertical dimension, are thin, in the range of 0.03 to 0.3 $\mu m$, so the presence of small particles can cause electrical leakage currents which can cause a pixel or row of pixels to fail. Also, considering that a display may have 1,000×1,000 lines, there are one million pixels being controlled by active semiconductor transistors.

Further, since the substrate for liquid crystal display panels is typically glass, an insulating material, there is an increased tendency for the plasma to expand toward the chamber walls and for arcing to occur between the platen electrode (suceptor) on which the glass substrate is supported and the aluminum walls of the process reactor chamber.

Thus, it is important in the production of semiconductor substrates, and particularly flat panel liquid crystal displays, to develop means for: 1) confining plasma exposure boundaries, thereby reducing the formation of deposits on the reactor chamber walls; 2) cleaning the reactor walls in a manner which does not cause a gradual build up of contaminants on the reactor walls; and 3) preventing arcing from the plasma-generating electrodes to conductive reactor chamber surfaces.

SUMMARY OF THE INVENTION

In accordance with the present invention, a ceramic barrier material is used to protect conductive, typically metallic, surfaces of a process reactor chamber which have the potential of becoming contaminated during plasma processing. The ceramic barrier material is selected to be a good insulator, so that a charge builds up on the surface of the ceramic barrier material. This charge build up is approximately equal to the plasma potential which is typically, for example, less than about 20 volts. This charge build up helps repel the plasma away from the surface of the ceramic barrier material, thereby confining the plasma and greatly reducing deposits formed on the reactor chamber walls. In addition, it has further been discovered that such a ceramic barrier material can be cleaned using fluoride-containing etch gases without the build up of contaminants upon the ceramic which can later become a source of particulate contamination.

Further, it is well established that process chambers should be as small in volume as possible in order to minimize the time required to change pressure and thereby maximize productivity. Therefore the chamber walls should be as close to the electrodes as possible. Because the chamber is only slightly larger than the susceptor, the ceramic barrier material prevents arcing (or intense discharges) between the susceptor and the nearby conductive surfaces of the reactor chamber.

The ceramic barrier material need not shield the entire inner surface of the process reactor chamber, but it should protect rector chamber surfaces surrounding the area in which plasma will be generated. In addition, it is preferred that the ceramic liner protect reactor chamber surfaces likely to be exposed to plasma etch cleaning processing.

The ceramic barrier material typically comprises aluminum oxide since this is relatively inexpensive and readily available. The aluminum oxide must be sufficiently pure that it does not "out-gas" or include contaminants that could be sputtered onto the substrate during process operation, and it must be chemically stable when exposed to the particular etching processes contemplated. The aluminum oxide or other metal-oxide ceramic can be a single crystal oxide, polycrystalline oxide, or amorphous oxide. Flame sprayed or plasma sprayed aluminum oxide can also be used to form the ceramic barrier.

Other materials which can be used to form the ceramic liner include by way of illustration., but are not limited to, the oxide and fluoride forms of aluminum, magnesium, and tantalum.

The thickness of the ceramic barrier material is typically at least about 0.005 inches (130 micrometers), and preferably ranges from about 0.01 inches (250 micrometers) to about 0.25 inches (6.4 millimeters).

BRIEF DESCRIPTION OF THE DRAWINGS

FIG. 1A shows a vertical cross-section of the reactor, partly in schematic. This cross-sectional view makes the relative structural locations of the various reactor elements clear. FIG. 1B shows the top plan view of the same reactor, shown with the cover open. These illustrations, from U.S. Pat. No. 4,960,488, to Law et al. are presented to provide an improved understanding of the structural relationship between the plasma processing areas of the reactor and the reactor chamber walls which can be contaminated by active species from the plasma.

FIG. 2A shows a simplified schematic of a vertical cross section of a combined CVD/PECVD reactor of the kind used to fabricate flat panel liquid crystal displays. FIG. 2B shows a top plan view of a combined CVD/PECVD reactor. The reactor is shown with the cover open.

DETAILED DESCRIPTION OF THE PRESENT INVENTION

In accordance with the present invention, a method and apparatus are provided for use in CVD, PECVD, and other types of process chambers which:

1) confine plasma exposure boundaries, thereby reducing the formation of deposits on process chamber walls;
2) enable etch cleaning of reactor walls in a manner which does not cause a gradual build up of contaminants on process chamber walls; and
3) prevent arcing from plasma-generating electrodes within the CVD process chamber to conductive reaction chamber surfaces.

In particular, this method and apparatus enable the operation of plasma-enhanced chemical vapor deposition processes within the reactor chamber with reduced film deposition upon reactor chamber walls. Further, the reactor chamber can be periodically cleaned using halogen-containing (typically fluorine-containing) gas and plasma etching techniques, without a film residue forming upon reactor chamber walls.

In accordance with the present invention, CVD and/or PECVD process chamber walls which are significantly exposed to active species during plasma processing or cleaning operations are lined with a relatively thick, electrically insulating ceramic barrier material.

Figure 1A:
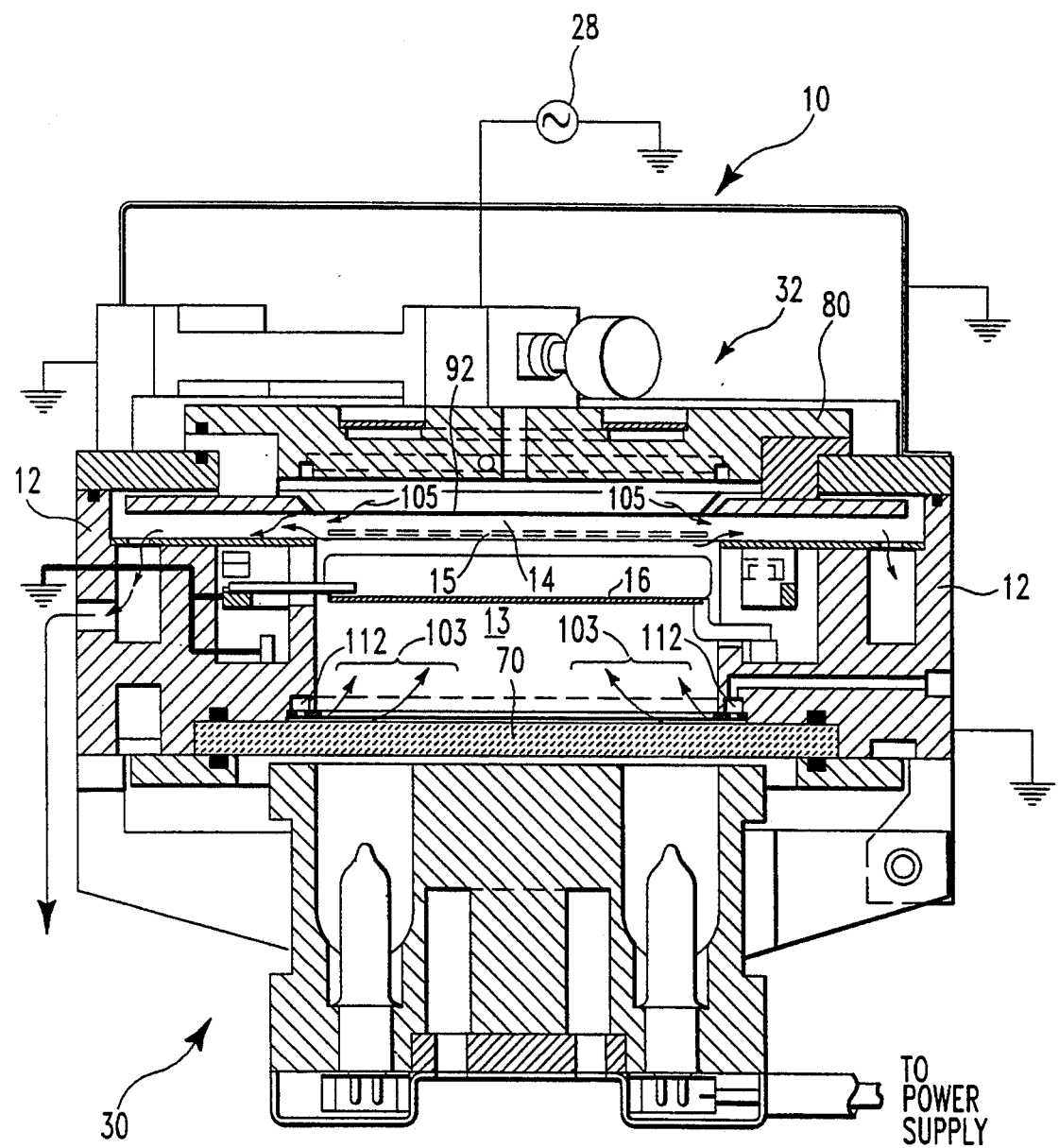
FIGS. 1A & 1B illustrate a widely used prior art combined CVD and plasma-enhanced CVD (PECVD) semiconductor processing reactor.
Figure 1B:
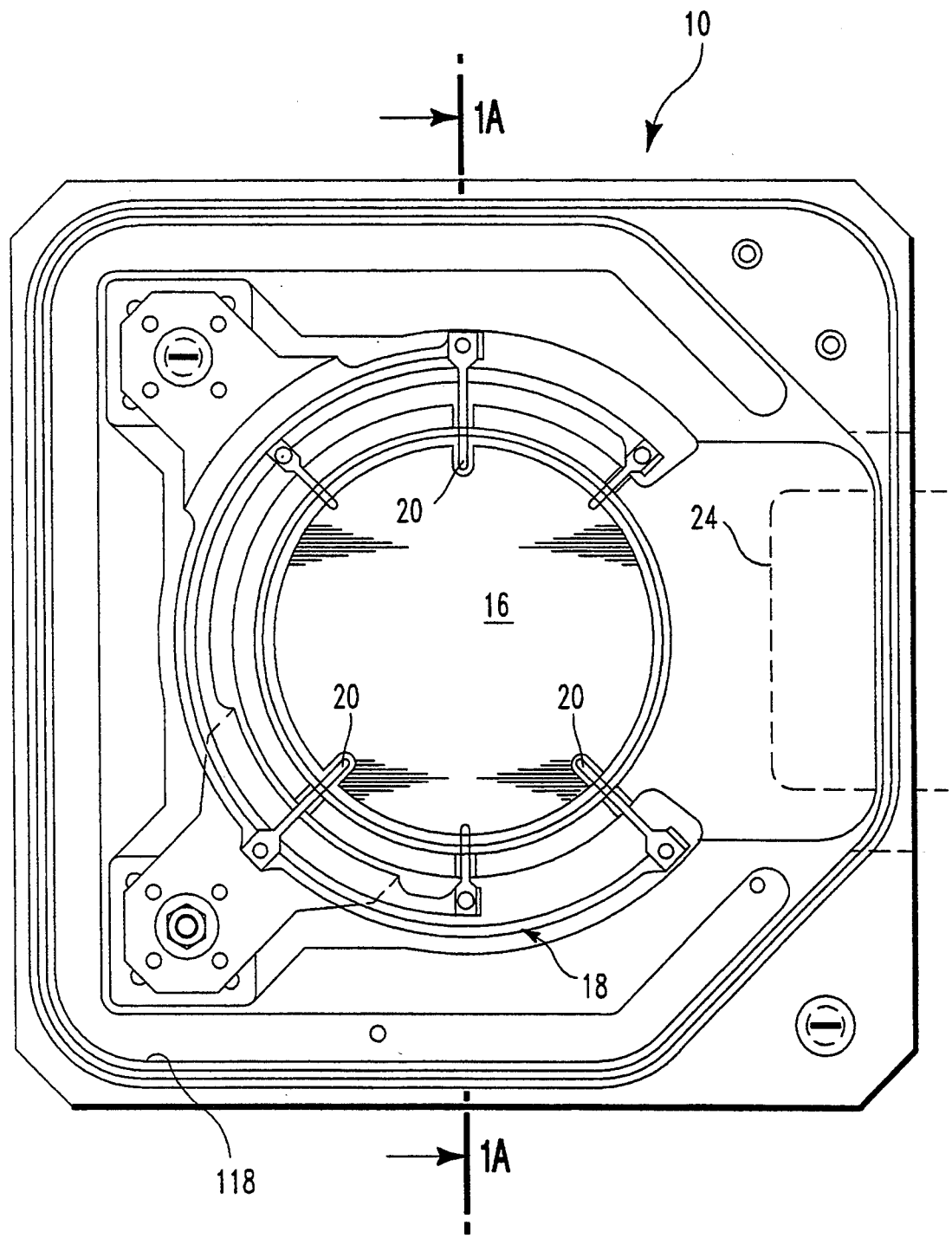

A prior art combined CVD and PECVD semiconductor processing reactor is shown in FIGS. 1A & 1B. A vertical cross-sectional schematic of the processing reactor is shown in FIG. 1A, with a top plan view shown in FIG. 1B. The top plan view is shown with the cover open. The reactor system 10 comprises a housing 12 (also termed a "chamber"), typically made of aluminum, which defines an inner vacuum chamber 13 that has a plasma processing region 14.

The reactor system 10 includes a wafer-holding susceptor 16, wafer support fingers 20, and a wafer transport system 18 which cooperates with an external robotic blade 24. The reactor system 10 further comprises a gas manifold (not shown), which applies process gas and purging gas from a distribution system 32 present within housing cover 80. An RF power supply and matching network 28 create and sustain a process gas plasma from the inlet gas while a lamp heating system 30, passes radiation through quartz window 70 and heats the susceptor 16 and wafer 15 positioned thereon, to effect deposition of active species from the plasma onto the wafer 15.

The plasma processing region 14 is significantly limited in area. Preferably in addition, a second purge gas manifold 112 is positioned beneath the wafer processing area to provide purge gas flow 103 upwardly across the bottom of the susceptor 16. Such purge gas flow 103, in combination with gas flow 105 from the distribution system 32 (including apertured manifold face plate 92) is used to help prevent depositions from the plasma from accumulating in general on surfaces in reactor chamber 13 and particularly on surfaces beneath the susceptor 16.

Despite the actions taken to prevent CVD accumulations upon chamber walls of the process reactor, problems with such depositions have not been eliminated, and reactor cleaning must be conducted periodically. Plasma-assisted etching is the preferred method of cleaning, since this reduces the danger of particles contaminating the reactor. Since the reactor chamber walls are typically aluminum, which is directly attacked by chlorine gas plasmas comprising, fluorine gas plasmas are commonly used for plasma-assisted etch cleaning. However, as previously described, this results in the gradual build up of on the aluminum walls of aluminum trifluoride deposits, which can flake off, providing particulate contaminants within the process reactor chamber.

Figure 2A:
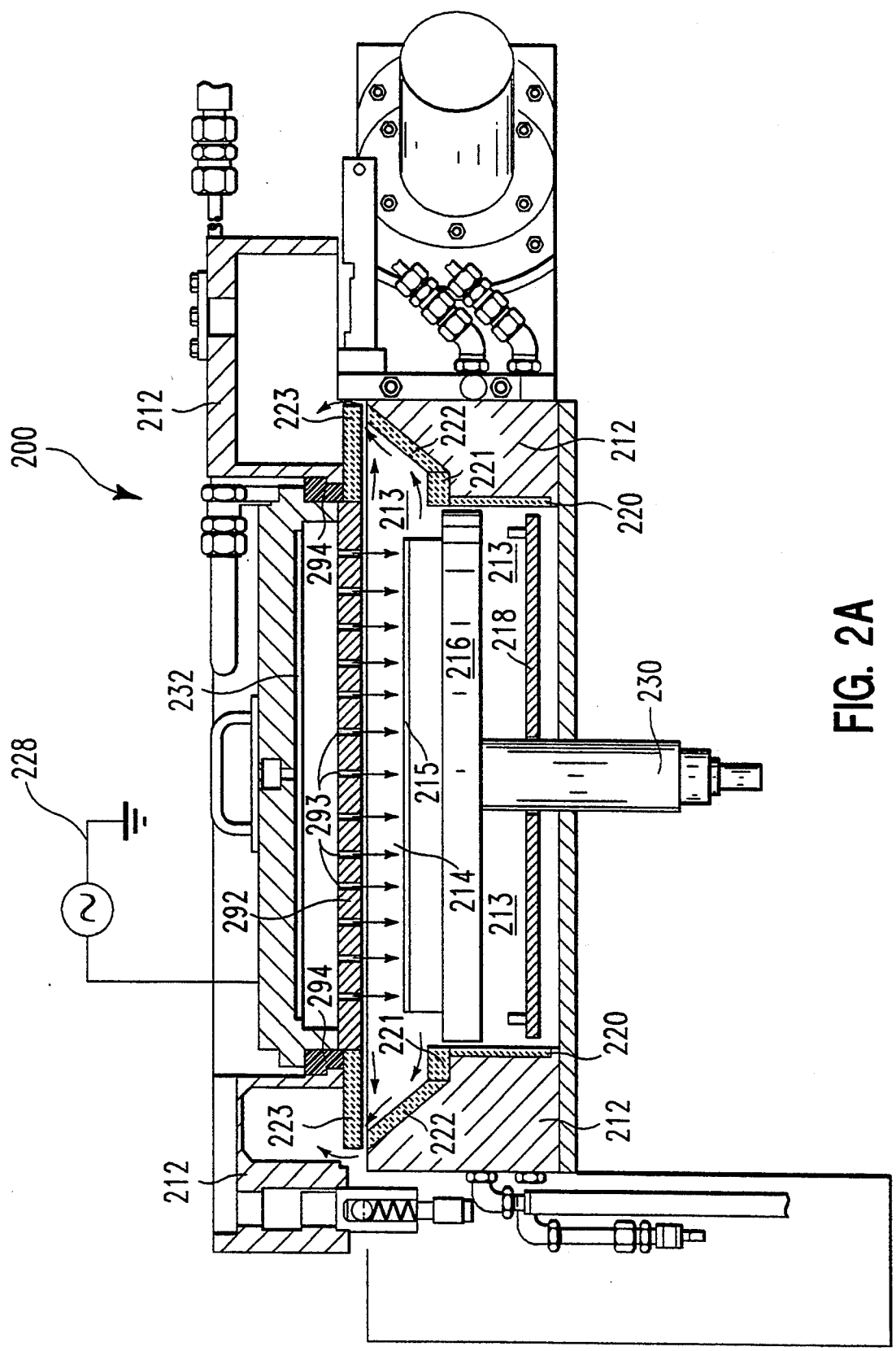
FIGS. 2A and 2B illustrate a preferred embodiment of the present invention as employed in a CVD and PECVD semiconductor processing reactor.
Figure 2B:
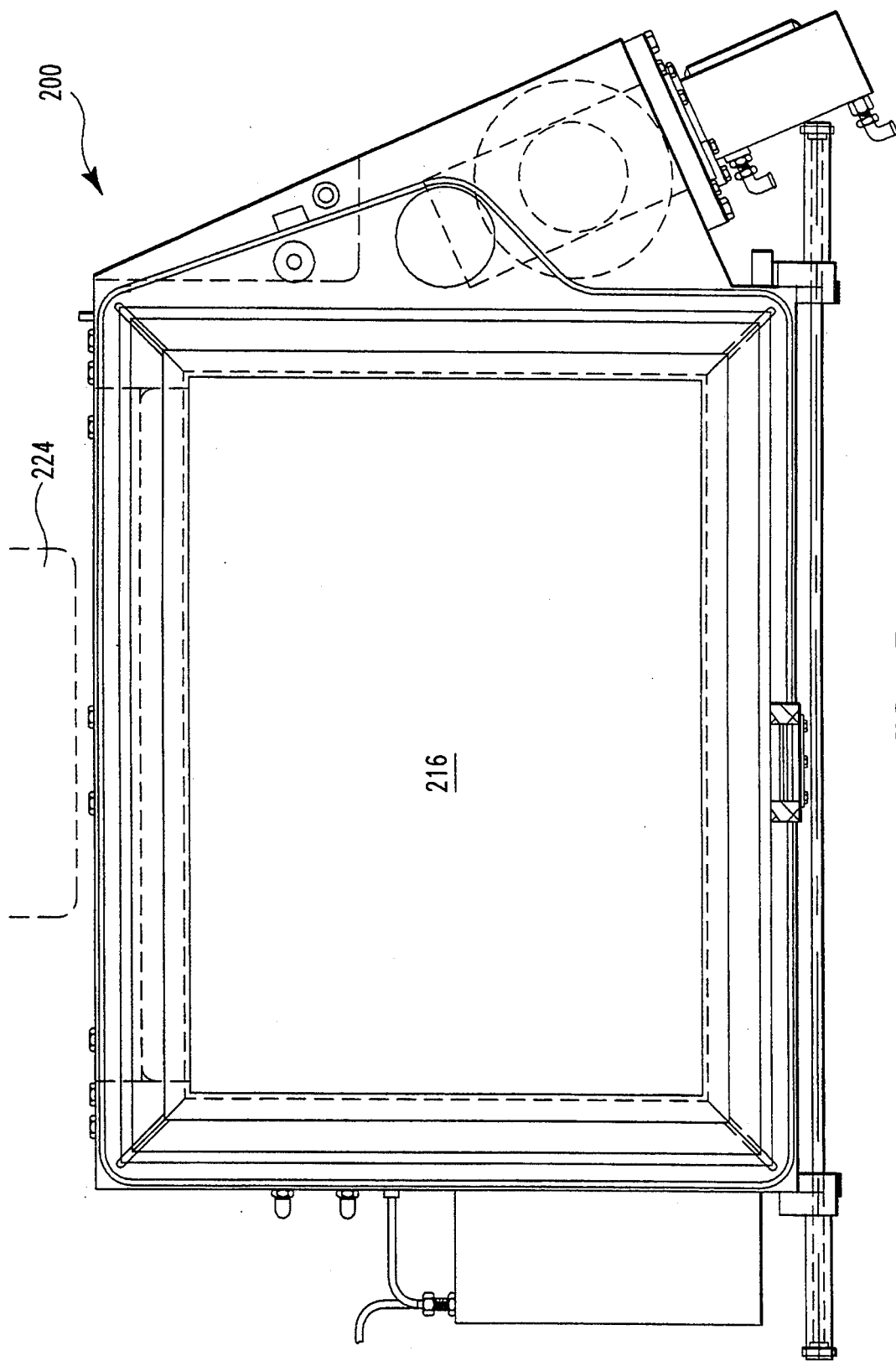

The process reactor used in fabrication of liquid-crystal, flat-panel displays has many features common to the semiconductor processing reactor described above. However, the flat-panel displays are generally rectangular so that the top plan view of the reactor, with the cover open, would appear as shown in FIG. 2B. With reference to FIGS. 2A and 2B, which show a reactor system 200, a rectangular flat-panel display glass substrate 215 sits upon a raised step of a rectangular suceptor 216. A display-panel substrate transport system 218 cooperates with a normally external robotic arm 224 to move glass substrates 215 into and out of an inner vacuum chamber 213 of the reactor 200. The inner vacuum chamber 213 is encompassed by reactor housing (or chamber) 212 including a hinged lid. The reactor system 200 further comprises a gas manifold within the lid which applies process gas and purging gas from a distribution system 232 above the substrate 215. A rectangular face plate 292 having hundreds of orifices 293 applies process gas and purge gas to the substrate 215. An RF power supply and matching network 228 create and sustain a process gas plasma from the inlet gas issuing from the face plate 292. This process gas plasma is principally contained in a plasma processing region 214 above the substrate 215. However, due to the size of the insulating glass substrate 215 relative to the reactor housing 212, there would, without benefit of the present invention, be a tendency for the plasma to migrate toward the reactor housing 212. There would also be a tendency for the plasma to form in the space beneath the susceptor 216 and for arcing to occur between the susceptor 216 and the lower side walls of the reactor housing 212. These last effects arise because the susceptor 216 is imperfectly grounded through its sliding shaft 230 to the reactor housing 212.

Without the method and apparatus of the present invention, the plasma formed in the plasma processing region 214 migrates towards the aluminum reactor housing 212, leaving deposits on the walls of this process/reactor chamber which would otherwise need to be periodically cleaned using fluoride gas plasma etching. As previously discussed, this results in the reactor chamber walls having film residue made of aluminum fluoride and other compounds which build up and flake off, causing particulate contamination within the reactor chamber.

Those skilled in the art have used ceramic components for particular elements within semiconductor processing reactors for a number of years. A ceramic is a metal oxide that is typically electrically insulating and the crystallinity of which varies among amorphous, glassy, microcrystalline, and singly crystalline, dependent on material and its processing. Applicants, for example, have used an alumina baffle to deflect active species from the electrode plate of a plasma-assisted CVD reactor, in an attempt to avoid the formation of deposits upon the electrode plate. Sherman has used a small, enclosed plasma generation chamber of aluminum oxide, as previously discussed.

Anodized aluminum has been widely used for baffles and elements in the area of the electrodes of the plasma generator. However, an anodized surface of aluminum is electrically leaky permitting current leakage to a conductive aluminum beneath and, therefore, attraction of plasma toward the anodized aluminum surface. Thus, anodized aluminum does not significantly act to confine the plasma and does not sufficiently aid in reducing arcing from a plasma-generating electrode toward the anodized aluminum surface. In all of the known art cases it was still necessary to clean deposit build-up off the aluminum walls of the reaction chamber and such cleaning resulted in the formation of aluminum-comprising deposits which eventually contributed a source of particulates to the reaction chamber.

The characteristic that distinguishes anodized aluminum from ceramic alumina for this application is the two layer structure of the anodized aluminum compared to the nearly homogenous structure for bulk or deposited alumina. The top layer of anodized aluminum is porous and has poor electrical insulation properties. This layer has a high degree of contamination ($H_2O$, $SO_3$, Cr or other species) from the anodizing process and reacts chemically differently from the pure material. Channels extend vertically through the top layer to within a few hundred angstroms of the underlying aluminum affording passage for an electrically conductive plasma so that only the bottom layer of 200 angstroms or so acts as an electrical barrier to the plasma. The bottom layer is the barrier layer which is a good electrical insulator and is a more dense, pure aluminum oxide. Typically anodized aluminum total thickness is limited to less than 0.005 inches (approximately 130 micrometers) of which only a few hundred angstroms (hundredths of micrometers) are the barrier layer.

The ceramic material of the present invention is a non-porous, homogeneous material. It is a good electrical insulator, and because it can be made in a relatively pure form (approximately 99% or better) it has a low degree of chemical reactivity in the plasma environment. The bulk, free standing ceramic material typically :has a thickness of at least 0.005 inches (approximately 127 micrometers) and preferably has a thickness ranging between 0.01 inches (approximately 250 micrometers) and 0.25 inches (6,350 micrometers).

Applicants have discovered that when ceramic such as aluminum oxide is cleaned with etch plasmas formed from fluoride-containing gas, no build up of aluminum trifluoride occurs. Thus, a reactor of aluminum oxide can be cleaned using standard etch plasma techniques without the formation of particulates. However, aluminum oxide being impractical as a reactor fabrication material in itself, applicants prefer to use this material as a barrier material, typically a liner, to protect a metallic reactor wall. Applicants discovered that it is preferable to have an aluminum oxide thickness of at least 0,005 inches (approximately equals to 130 micrometers) to confine the deposition plasma and to prevent the fluoride-comprising plasma etch gas from penetrating the ceramic barrier to the aluminum surface being protected beneath. Thus, a coating of lesser thickness may not enable the satisfactory cleaning of plasma process chambers using known plasma etching procedures.

As shown for the embodiment of FIG. 2A, a set of ceramic liners 220, 221, and 222 are placed adjacent to the aluminum housing 212. These liners 220, 221, and 222 are machined from solid alumina of high purity (99%) and hence are highly insulating, whether at DC, RF, or in the presence of a plasma. The importance of high purity aluminum oxide is discussed by Lorimer et. al. Since they are machined into :free standing form, they should have a minimum thickness of 130 micrometers (0,005 inch). Such a thickness more than adequately provides the desired resistance. A similarly sized and insulative ceramic annulus 223 is attached to the periphery of the face plate 292. Such an annulus 223 has been previously used to provide electrical insulation and support for the face plate 292, which is electrically connected to the RF source 228, and to protect a Teflon insulator 294 at its back; however, it additionally provides many of the same advantages as the ceramic liners 220, 221, and 222. The bottom surface of the face plate 292 is typically anodized.

The insulative upper ceramic liners 221 and 222 and ceramic annulus 217 repel a plasma and thus confine the processing plasma to a processing region more closely adjacent to the substrate 215, thereby decreasing deposits on the walls of the chamber housing 212 and also increasing processing efficiency. The lower ceramic liner 220 electrically isolates the susceptor 216, which is partially floating electrically, from the grounded chamber housing 212. It prevents arcing between the periphery of the susceptor 216 and the chamber housing 212 and also prevents the formation of a plasma beneath the susceptor 216. Although it might be preferable to additionally cover the bottom of the inner vacuum chamber 213 with another alumina liner, this appears to be unnecessary because the disc forming the major part of the transport system 218 is a bulk ceramic and because the primarily aluminum susceptor 216 is supported on its bottom by another ceramic disc.

The ceramic liners 220, 221, and 222 and ceramic annulus 223 prevent the build up of deposits upon the surface of the chamber housing 212 during general PECVD processing. Deposits which do build up on these ceramic members 220–222 as well as on the anodized bottom surface of the face plate 292 can be cleaned off using standard plasma etching techniques without the need for wet chemical cleaning, which causes the formation of compounds the particulates of which contaminate the inner vacuum chamber 213.

Although free-standing liners have been described above, ceramic layers which are deposited without consuming the underlying aluminum may be made having sufficient thickness and resistivity so as to provide the advantages of bulk alumina without the disadvantages of anodized aluminum surfaces. For example, flame sprayed or plasma sprayed aluminum oxide forms a good insulating layer at thicknesses less than 127 micrometers but substantially greater than the effective barrier thickness of a few hundred angstroms for anodized aluminum, for example, at 1 micrometer or more. A thickness of more than 20 micrometers would be preferred, and a thickness corresponding to bulk ceramics would be most preferred.

Alumina ($Al_2O_3$) is the form of aluminum oxide used in the embodiment described above, but other insulative materials can provide similar effects, for example, the oxides and fluorides of aluminum, magnesium, and tantalum. Some of these are crystalline or polycrystalline insulating materials. Some may be made as glassy ceramics. These materials are all electrically insulating and generally robust in a plasma etching environment and should not create undesired particulates in presence of the plasma. Other materials can alternatively be used.

Although the invention is particularly useful with aluminum chambers, other chamber materials may be used such as stainless steel.

The preferred embodiment of the present invention as described above and shown in the Figures is not intended to limit the scope of the present invention, as demonstrated by the claims which follow, since one skilled in the art can, with minimal experimentation, extend the scope of the embodiments to match that of the claims.

What is claimed is:

1. In a process chamber in which a processing plasma is generated adjacent to a substrate held on a substrate holder, the improvement comprising a free-standing, electrically insulative liner disposed adjacent to metallic walls of said process chamber facing said processing plasma.

2. The improvement as recited in claim 1, wherein said liner comprises a ceramic.

3. The improvement as recited in claim 1, wherein said liner comprises a material chosen from the group consisting of the oxides and fluorides of aluminum, magnesium, and tantalum.

4. The improvement as recited in claim 3, wherein said material comprises alumina.

5. The improvement as recited in claim 3, wherein said liner has a thickness of at least 127 micrometers.

6. The improvement as recited in claim 5, wherein said thickness is greater than 250 micrometers.

7. The improvement as recited in claim 1, wherein said substrate holder separates an first part of said process chamber where said substrate is disposed and a second part of said process chamber and wherein said liner is disposed on all lateral portions of said first part in view of said substrate and is further disposed on portions of walls of said second part.

8. In a process chamber in which a processing plasma is generated adjacent to a substrate held on a substrate holder, the improvement comprising a wholly deposited insulative liner disposed adjacent to metallic walls of said process chamber facing said processing plasma and having an effective plasma electrical barrier thickness greater than 200 Angstroms.

9. The improvement as recited in claim 8, wherein said thickness is at least 1 micrometer.

10. The improvement as recited in claim 9, wherein said thickness is greater than 20 micrometers.

11. The improvement as recited in claim 10, wherein said liner has a physical thickness of at least 127 micrometers.

12. A processing system, comprising:
a vacuum chamber having electrically conductive walls;
electrodes for generating a plasma within said chamber, in an area adjacent to a substrate being processed;
gas ports to said chamber providing a gas for said plasma; and
an electrically insulative liner covering portions of said walls facing said plasma and having an effective plasma electrical barrier thickness of substantially greater than 200 Angstroms.

13. A system as recited in claim 12, wherein said electrical barrier thickness is greater than 20 micrometers.

14. A system as recited in claim 13, wherein said liner has a physical thickness of at least 127 micrometers.

15. A system as recited in claim 14, wherein said liner comprises a free-standing body placed adjacent to said walls.

16. A system as recited in claim 12, wherein said liner comprises a composition selected from the group consisting of oxides and fluorides of aluminum, magnesium, and tantalum.

17. A method of protecting conductive portions of a plasma processing chamber, comprising the steps of:
providing an insulative barrier material having an effective plasma electrical barrier thickness greater than 200 Angstroms on electrically conductive portions of said processing chamber otherwise exposed to ions of a plasma; and
generating said plasma in a region of said processing chamber containing a substrate to be processed.

18. A method as recited in claim 17, wherein said barrier material is at least one free-standing body placed adjacent to said electrically conductive portions of said processing chamber.

19. A method as recited in claim 17, wherein said barrier material has a thickness of at least 127 micrometers.

20. A method as recited in claim 17, wherein said providing step deposits said insulative barrier material on said electrically conductive portions substantially without consuming portions of them and having an effective plasma electrical barrier thickness greater than 200 Angstroms.

21. A method as recited in claim 17, wherein said barrier material is a ceramic.

22. A method as recited in claim 17, wherein said barrier material is selected from the group consisting of the oxides and fluorides of aluminum, magnesium and tantalum.

23. A method as recited in claim 17, further comprising generating a halogen-containing gas plasma in said processing chamber while said substrate is removed from said chamber so as to clean said insulative barrier material.

24. The improvement as recited in claim 8, wherein said wholly deposited insulative liner has an effective plasma electrical barrier thickness greater than that provided by 200 Angstroms of aluminum oxide.

25. The improvement as recited in claim 8, wherein said electrical barrier thickness is at least equivalent to that provided by 1 micrometer of aluminum oxide.

26. A processing system as recited in claim 12, wherein said electrically insulative liner has an effective plasma electrical barrier thickness greater than equivalent to that provided by 200 Angstroms of aluminum oxide.

27. A processing system as recited in claim 12, wherein said electrical barrier thickness is greater than equivalent to that provided by 20 micrometers of aluminum oxide.

28. The method of claim 17, wherein said insulative barrier material has an effective plasma electrical barrier thickness greater than that equivalent to 200 Angstroms of aluminum oxide.

29. The method of claim 17, wherein said providing step deposits said insulative barrier material on said electrically conductive portions substantially without consuming said conductive portions, and wherein said insulative barrier material has an effective plasma electrical barrier thickness greater than that equivalent to 200 Angstroms of aluminum oxide.

* * * * *